United States Patent [19]
Hekimian et al.

[11] 3,963,992
[45] June 15, 1976

[54] LINEAR AGC CIRCUIT WITH CONTROLLED DUTY CYCLE SAMPLING MEANS

[75] Inventors: Norris C. Hekimian, Rockville, Md.; James F. Turner, Oakton, Va.

[73] Assignee: Hekimian Laboratories, Inc., Rockville, Md.

[22] Filed: Aug. 14, 1974

[21] Appl. No.: 497,483

Related U.S. Application Data

[62] Division of Ser. No. 352,552, April 19, 1973, Pat. No. 3,862,380.

[52] U.S. Cl. .............................. 330/127; 325/408; 328/151; 328/168; 330/10
[51] Int. Cl.² ........................................ H03G 3/00
[58] Field of Search ............ 325/407, 408; 328/151, 328/168, 171; 330/9, 10, 51, 96, 127, 128, 129

[56] References Cited
UNITED STATES PATENTS

| | | | |
|---|---|---|---|
| 2,974,224 | 3/1961 | Ule | 325/407 |
| 3,493,875 | 2/1970 | Stuckert | 328/151 |

Primary Examiner—R. V. Rolinec
Assistant Examiner—Lawrence J. Dahl
Attorney, Agent, or Firm—Rose & Edell

[57] ABSTRACT

An intermodulation distortion analyzer generates two pairs of sinusoidal test tones to serve as a test signal for the channel under test. The two pairs of tones simulate two respective noise band test signals but eliminate the long time averaging required for measurements when noise bands are used. A highly linear AGC circuit employs sampling at an output-controlled duty cycle to maintain a constant reference level for the analyzer. This reference level permits automatic distortion measurements to be read out directly in db below the test signal. An RMS detector circuit for second order intermodulation products employs feedback control to maintain the input signal to a squaring circuit constant. Squaring of the constant level sinusoids produces RMS DC components which can be separated for direct measurement. A distortion circuit provides known levels of second and third order intermodulation in the test signal to permit accurate check out of the analyzer.

8 Claims, 5 Drawing Figures

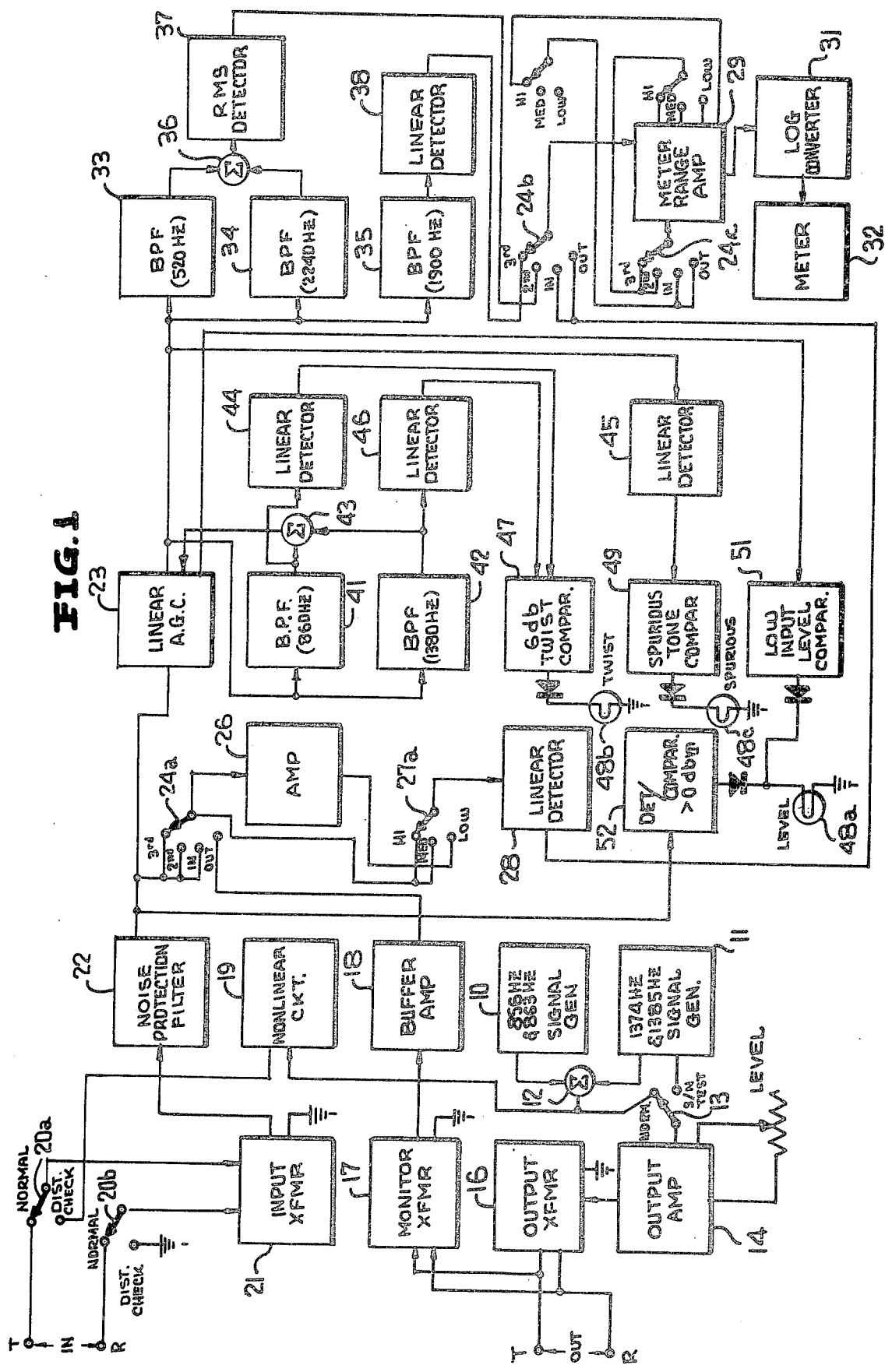

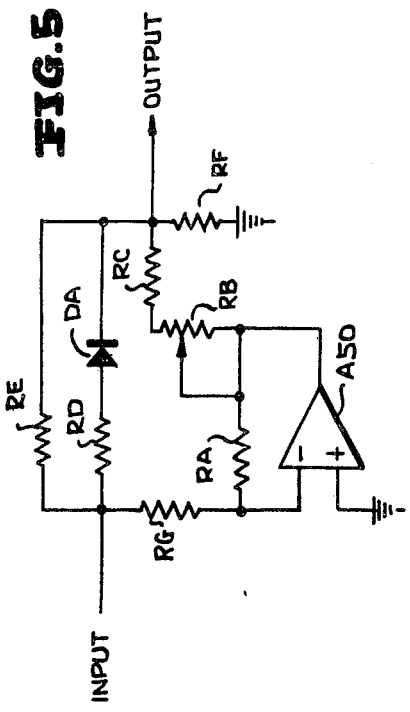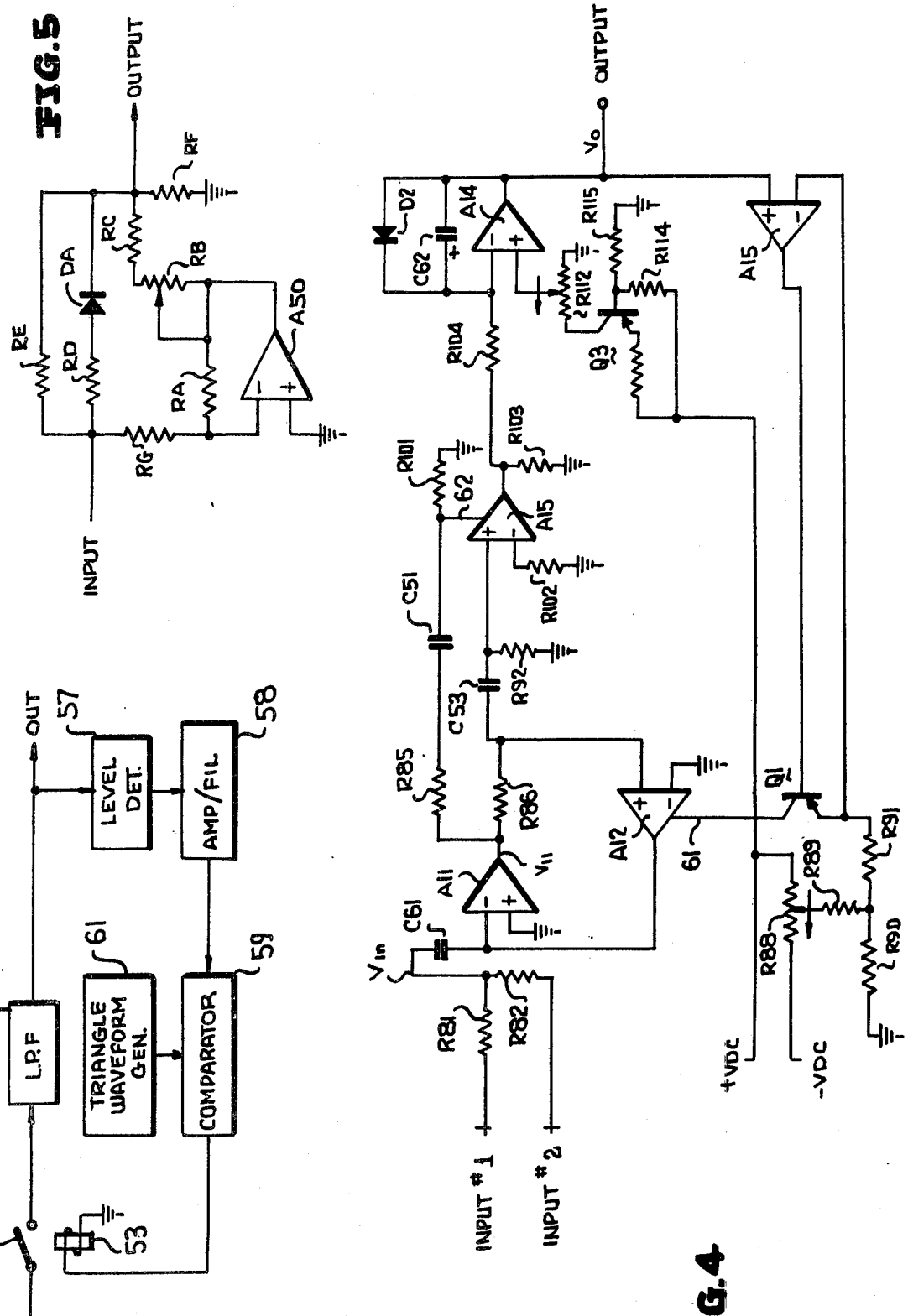

LINEAR AGC CIRCUIT WITH CONTROLLED DUTY CYCLE SAMPLING MEANS

This is a division of application Ser. No. 352,552, filed April 19, 1973, now U.S. Pat. No. 3,862,380.

BACKGROUND OF THE INVENTION

The present invention relates to monitoring non-linear distortion in the transmission of voice and voice band data. More particularly, the present invention relates to a non-linear distortion meter and circuitry employed therein.

Common carrier telephone channels, both switched and dedicated, now carry a variety of non-voice signals. These signals usually consist of one or more tones which are amplitude and/or phase modulated by either analog or digital information. Each signal format is impaired to varying degrees by the physical limitations, interferences, and design compromises imposed by nature and economics. Naturally it is desirable to be able to quickly and simply measure the limitations of a transmission channel; however, until the present invention there has been no really practical approach to measuring the full effects of amplitude distortion in a telephone channel.

Amplitude distortion on voice frequency telephone channels can degrade voice quality and seriously impair data transmission. Unfortunately, conventional distortion measuring techniques are inadequate for telephone channel tests. A simple harmonic distortion test has a serious measurement uncertainty in channels having multiple distortion sources combined with envelope delay or frequency offset. Total distortion tests, on the other hand, have difficulty distinguishing distortion from channel noise; further, such tests cannot separate the various types of distortion sufficiently to assist in fault isolation.

Bell System Technical Reference, PUB 41008, entitled "Analog Parameters Affecting Voiceband Data Transmission - Description of Parameters", and dated October 1971, describes an intermdoulation technique for measuring non-linear distortion in voice channels. Pages 16–24 of this publication presents a detailed analysis of the common sources of both second and third order distortion products and the effects of typical channel conditions on their measurement. The publication further illustrates why the intermodulation technique is more accurate and useful than the harmonic and total distortion techniques.

The intermodulation technique recommended by the aforementioned Bell System Technical Reference utilizes as test signals two narrow bands of Gaussian noise, centered about 860 Hz and 1380 Hz, respectively. The noise bands are used rather than discrete tones because the noise spectrum produced by individual tones in PCM systems is not flat and continuous but instead is discrete; the discrete components add or beat with the non-linear distortion product being measured causing inaccurate and time-variable readings. The noise bands produce a flat continuous spectrum. Moreover, the crest factor (i.e. — ratio of peak value to RMS value) is on the order of 10 db for a Gaussian distribution, thereby assuring that test signal peaks will be large enough to test the region of channel non-linearity; if two individual test tones are employed the crest factor is only 6 db and a thorough test of the channel non-linearity is not assured.

The noise bands are applied to the channel under test in which second and third order intermodulation distortion is to be measured. Third order distortion is measured as the signal component produced by the channel at 1900 Hz (i.e. $2 \times 1380 - 860$). Second order distortion is measured as the signal components produced by the channel at 520 Hz (i.e. $1380 - 860$) and 2240 Hz (i.e. $860 + 1380$).

The intermodulation measurement technique described above is fine in theory. In practice, however, the procedure is tedious because it is necessary to wait for at least thirty seconds, and usually more, for each reading to stabilize. This is due to the random nature of the noise band test signals. Specifically, within each narrow noise band the signal amplitude is changing randomly and arbitrarily small difference frequencies exist. Theoretically, the signal detector should average out these small difference frequencies and to do so would require an infinite time. In practice, a relatively long time period, on the order of a minute, is required in order to obtain a meaningful result.

It is therefore an object of the present invention to provide an intermodulation measurement technique which is as meaningful and accurate as that described above but which can be performed in a matter of a few seconds.

It is another object of the present invention to provide an improved intermodulation measurement technique which eliminates the need for using noise bands as test signals.

It is still another object of the present invention to provide a practical non-linear distortion analyzer and test set for telephone channels.

It is still another object of the present invention to provide novel circuits for particular use in a distortion analyzer and test set, including an automatic gain control, an RMS converter, and a non-linear circuit for producing stable and predictable second and third order distortion.

SUMMARY OF THE INVENTION

In accordance with the principles of the present invention, the two noise band test signals are replaced by two pairs of sinusoidal tones, the tones in each pair being closely spaced to approximate a noise band. The tone pair approach retains all of the advantages of the noise band approach, including a 9 bd crest factor, and eliminates the disadvantage of requiring long time averaging in metering. The shorter metering time not only expedites measurement operations but also permits the analyzer to follow time-varying distortion products which would be averaged out and obscured by the long metering time required by the noise band approach.

According to another aspect of the present invention an automatic gain control circuit samples an input signal at a duty cycle which varies with the level of the input signal to effect highly linear gain control. The linear operation introduces negligible distortion products and therefore is ideally suitable for use in a distortion analyzer apparatus.

In still another aspect of the present invention the detected second order intermodulation products, in the form of sinusoidal signals, are combined in a novel RMS converter circuit. This converter employs a squaring circuit and a feedback loop in which the output signal is used to maintain the input signal to the squaring circuit constant. The output signal from the squaring circuit is therefore also constant and is fed to an active low pass filter having a high DC gain. The resulting DC output signal from the active filter is the RMS value of the combined sinusoidal intermodulation products.

In still another aspect of the present invention, a distortion circuit is provided to produce a known amount of second and third order distortion in a test signal to permit operational checkout of the distortion analyzer. The distortion circuit employs an operational amplifier and three parallel signal paths. One path is entirely resistive and produces a linear component in the output signal. Second order distortion is produced in a resistor-diode series path. Third order distortion is produced by the operational amplifier itself in combination with a resistive path. The three components are superimposed on one another to provide the desired output signal.

BRIEF DESCRIPTION OF THE DRAWINGS

The above and still further objects, features and advantages of the present invention will become apparent upon consideration of the following detailed description of specific embodiments thereof, especially when taken in conjunction with the accompanying drawings, wherein:

FIG. 1 is a functional block diagram of a distortion analyzer according to the present invention;

FIG. 2 is a functional block diagram of a linear automatic gain control circuit employed in the distortion analyzer of FIG. 1;

FIG. 4 is a detailed schematic diagram of an RMS converter circuit employed in the distortion analyzer of FIG. 1; and FIG. 5 is a detailed schematic diagram of a non-linear distortion circuit employed in the distortion analyzer of FIG. 1.

DESCRIPTION OF THE PREFERRED EMBODIMENTS

Figure 3:
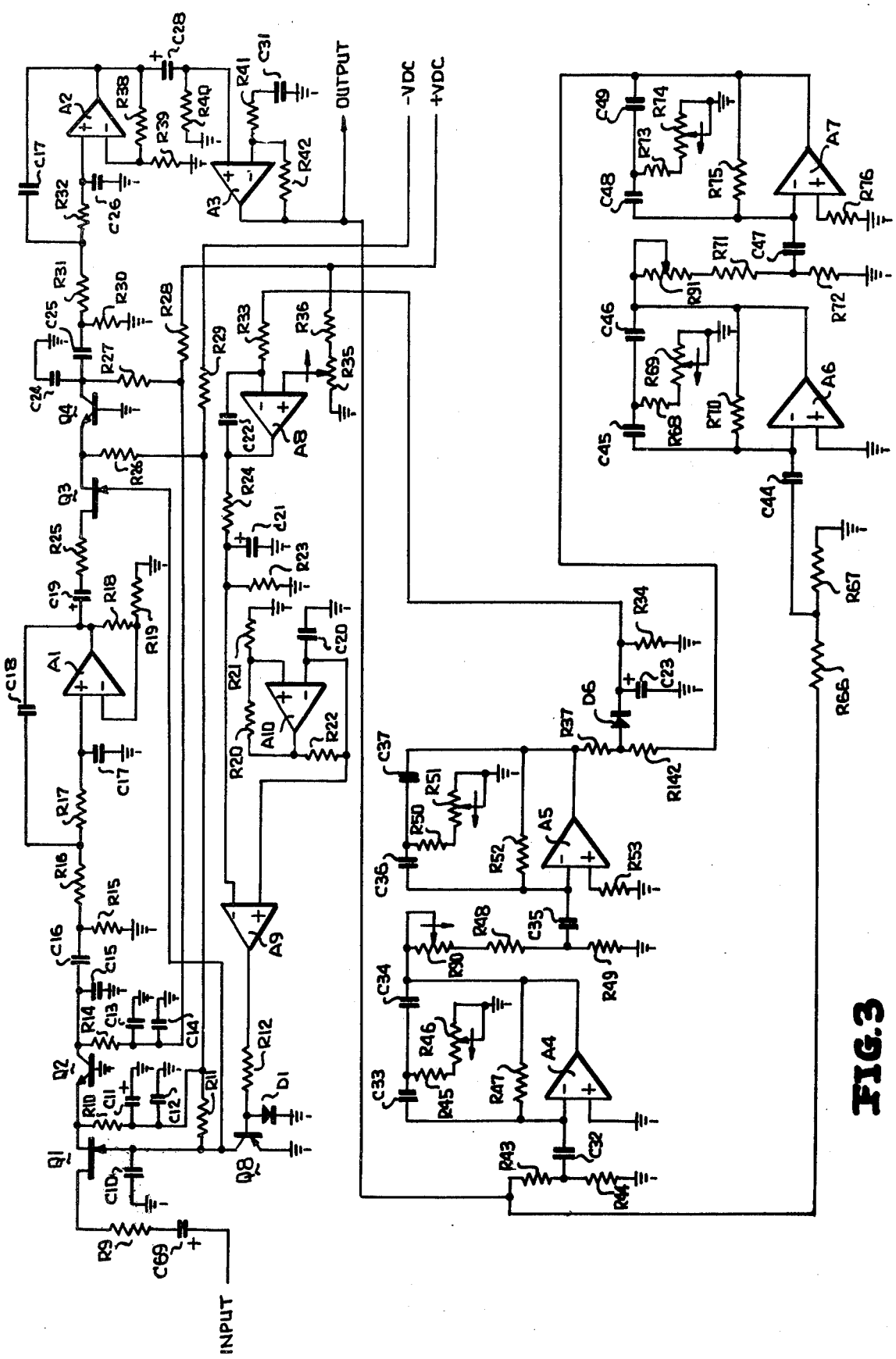
FIG. 3 is a detailed schematic diagram of the automatic gain control circuit of FIG. 2.

Referring specifically to FIG. 1 of the accompanying drawings, a distortion analyzer includes two test signal generators 10 and 11 which provide test signals to be applied to the telephone channel under test. Generator 10 provides sinusoidal test signals at frequencies of 856 Hz and 863 Hz; generator 11 provides sinusoidal test signals at frequencies of 1374 Hz and 1385 Hz. These signals are summed at 12 and applied through switch 13 (in its NORMAL position) to output amplifier 14. Switch 13 has two positions: in its NORMAL position the four summed sinusoidal test signals are applied to amplifier 14; in its S/N TEST position only the 1374 Hz and 1385 Hz signals are applied to amplifier 14. The output signal from amplifier 14 is fed to output transformer 16 which applies the test signals to the telephone channel under test. The output signal from transformer 16 is also applied to a monitor transformer 17 which in turn applies the signal to buffer amplifier 18. As is described hereinbelow, the signal from amplifier 18 can be metered to permit monitoring of the test signal level as applied to the channel under test.

The four test sinusoidal signals summed at 12 are also applied to a nonlinear circuit 19 which combines the signals in such a way as to introduce a known amount of distortion. Specifically, the non-linear circuit 19 introduces specific amounts of second and third order distortion products for use in checking the calibration and operativeness of the distortion analyzer. Circuit 19 is described in greater detail in relation to FIG. 5.

A two-position NORMAL-DIST. CHECK switch 20 includes two poles 20a and 20b. In the NORMAL position pole 20a connects the T line of the channel under test to input transformer 21; pole 20b connects the channel R line to the input transformer. In this manner the test signal applied to the channel under test is applied to the input circuitry of the distortion analyzer for processing. In the DIST. CHECK position of switch 20 the calibrated output signal from non-linear circuit 19 is applied to input transformer 21. The output signal from transformer 21 is applied to a noise protection filter 22 which passes only signals in the audio band.

The filtered signal from filter 22 is split between two paths. In one path it is applied to a highly linear automatic gain control circuit which provides a constant output signal level for an input range in excess of 40 db. The constant level is provided without introducing intermodulation distortion components larger than 50 db down from the test signal so that the signal is ideally suited for accurate processing by the distortion analysis portion of the unit. The other path for the signal from filter 22 includes one pole 24a of a three-pole four-position switch 24. Switch 24 serves as a meter switch and effectively connects four different signals for selective metering. The four positions of switch 24 are: third, second, IN, and OUT. In the third position the measured third order distortion product is metered; in the second position the measured second order distortion product is metered; in the INPUT position the input signal level is metered; and in the OUTPUT position the test signal can be metered before it is applied to the channel under test. In this regard the pre-transmitted test signal is applied from buffer amplifier 18 to the OUTPUT position at pole 24a; the received signal from filter 22 is applied to each of the third ORDER, second ORDER and INPUT positions of pole 24a.

The signal passed by pole 24a of the meter selection switch is applied to a 20 db amplifier and to pole 27a of three-pole three-position meter range selection switch 27. The output signal from amplifier 26 is also connected to pole 27a which is arranged to pass either the amplified or unamplified signal and thereby permit an on-scale meter reading. The signal passed by switch 27 is applied to linear detector 28 which converts the AC signal to a proportional DC level. This DC level is applied to the INPUT and OUTPUT positions of pole 24b which, in the INPUT and OUTPUT positions, passes the signal to meter range amplifier 29. Poles 27b and 27c of meter range switch 27 are arranged to adjust the gain of amplifier 29 to the selected gain level. The output signal from amplifier 29 is applied to a log converter circuit 31 which drives meter 32. Log converter circuit provides an output signal amplitude which is proportional to the logarithm of the level of the input signal applied thereto. A suitable circuit for providing this function is described in U.S. Patent application Ser. No. 299,139 filed Oct. 19, 1972, by Norric C. Hekimian and entitled "Logarithmic Converter".

The level controlled signal provided by AGC circuit 23 is applied to three bandpass filters 33, 34 and 35 having their passbands centered at 520 Hz, 2240 Hz and 1900 Hz, respectively. These frequencies are chosen because they represent specific intermodulation products of the test signals. Specifically the average frequency of the test tones provided by signal generator 10 is approximately 860 Hz; the average frequency of the test provided by signal generator 11 is approximately 1380 Hz. Second order intermodulation distortion products, if produced by the two pair of tones, would be present at 520 Hz (1380 − 860) and 2240 Hz (1380 + 860); a third order intermodulation product would be present at 1900 Hz (2 × 1380 − 860). The bandwidth requirement of filters 33, 34 and 35 is not critical, it only being necessary that the passband be wide enough to pass the entire band of the respective distortion products. A nominal passband of 50 Hz is suitable for all three filters.

The second order distortion products passed by filters 33 and 34 are summed at 36 and applied to an RMS detector circuit 37. Circuit 37, which is described in detail in relation to FIG. 4, provides a signal at the RMS value of the summed signals. This RMS signal is applied to the second ORDER position of pole 24b of the meter selection switch. The third order distortion product from filter 35 is applied to linear detector 38 which converts the distortion product to a proportional DC level. This DC level is applied to the third ORDER position of pole 24b of the meter selection. In this manner the second and third order intermodulation products can be individually metered when switch 24 is in the appropriate position.

The constant level output signal from AGC circuit 23 is also applied to each of bandpass filters 41 and 42 which have passbands centered at 860 Hz and 1380 Hz, respectively. As described above, these center frequencies correspond approximately to the average frequencies of the two test tone pairs. The passbands need only be wide enough to accommodate all of the respective test tone bands and a nominal width of 50 Hz is adequate. The output signals from filters 41 and 42 are summed at 43 and utilized in conjunction with the level control function of AGC circuit 23. This is described more fully in relation to FIG. 3. In addition, the output signal from filter 41 is applied to linear detector 44; the signal from filter 42 is applied to linear detector 46. Detectors 44 and 46 provide DC levels proportional to the signals passed by filters 41 and 42. These DC levels are applied to a window comparator circuit 47. This circuit monitors the relative difference between the amplitudes of the two test tone signals received from the channel under test. If the difference in amplitude between the two test tones is 6 db or more, window circuit 47 actuates the twist caution lamp 48b. A difference of 6 db or more indicates that the channel under test has a severe frequency response problem in that it is attenuating one test tone pair to a much greater extent than the other test tone pair. Under such circumstances a distortion analysis would not be accurate so the operator is warned by the lighted twist caution lamp 48b.

The output signal from AGC circuit 23 is also applied to linear detector 45 which detects AC signal and provides a proportional DC level. This level is applied to spurious tone comparator 49 which functions as a threshold detector to actuate its spurious caution lamp 48c if the signal level from detector 45 is above a predetermined limit level. This alerts the operator to the fact the AGC circuit output signal has a high level signal component which should not be present. The AGC output signal should only carry the test signal tones and their distortion products; if more than this is present there may be an error in the readings.

Another output signal from AGC circuit 23 is applied to low input level comparator circuit 51. This circuit actuates the level caution lamp 48a when the signal at the AGC circuit is below a predetermined level. The function of this circuit is to caution the operator if the signal level is too low to permit accurate distortion measurement.

The level caution lamp 48a is also lighted by detector/comparator 52 when the output signal from filter 22 is too high. Under such conditions the AGC circuit would be saturated by the input signal and would not provide a constant level without adding distortion.

In normal distortion measurement operation the two pairs of sinusoidal test tones are applied at equal power levels to the telephone channel under test via output transformer 16. These test tones, after traversing the channel, are applied, along with any intermodulation products produced by the channel, to input tranformer 21 from which they are passed to AGC circuit 23. The latter circuit adjusts the signal to a constant level and passes this constant level signal to filters 33, 34 and 35. Any second order intermodulation products produced in the channel under test at 520 Hz and 2240 Hz are passed by filters 33 and 34, respectively, summed, and applied to RMS detector 37. The output signal from the RMS detector is a DC level proportional to the RMS value of the combined second order intermodulation products. This level, relative to the test signal level, can be read directly from meter 32 when the meter selection switch 24 is in the second position.

The multi-component constant level output signal from AGC circuit 23 is also applied to filter 35 which passes only third order intermodulation products produced in the channel under test at 1900 Hz. The passed third order signal is detected at linear detector 38 which provides a DC level proportional to the amplitude of the 1900 Hz intermodulation product. This level, relative to the test signal, can be read at meter 32 when the meter selection switch is in its third position.

The distortion analyzer of FIG. 1 permits measurement of the level of the overall input signal as received from the channel under test. This measurement is effected with meter selection switch 24 in the IN position, thereby applying the signal from filter 22 to linear detector 28. The detected DC level is first log converted and then measured at meter 32.

It is also possible to measure the level of the combined test signals as applied to the channel under test. This is done by placing meter selection switch 24 in the OUT position, thereby connecting buffer amplifier 18 to detector 28. The resulting DC level is log converted and then measured at meter 32.

All of the foregoing measurements are made with mode switch 20 in the NORMAL position. In the DIST. CHECK position switch 20 permits the distortion analyzer operation to be checked. Specifically, the two test tone pairs, which are summed at 12, are applied to non-linear distortion circuit 19 which introduces second and third order intermodulation products of known level. This calibration signal is then applied to the input transformer 21 via switch 20 and is processed and analyzed in the same manner as the test signal received from a channel under test. By measuring the second and third order products of the calibration signal at meter 32, the operator can ascertain the operating status of the system. If the measured components of the calibration signal are not at a predetermined level, the analyzer can be assumed to the malfunctioning.

The system includes another test mode which enables the operator to determine the effects of test channel noise on the system. In this mode switch 13 is placed in the S/N TEST position and mode switch 20 is placed in the NORMAL position. In this condition only the 1374 Hz and 1385 Hz tone pair is applied to the channel under test, but the level of these two tones is approximately 3 db higher than in the normal test mode when both tone pairs are applied to the channel under test. The net effect is that the channel is still loaded with the same power provided by the four tones in normal operation; however, there is no intermodulation produced since the lower frequency tone pair is omitted. Under these conditions, with meter selection switch 24 in the second and third positions, meter 32 measures the residual channel noise level. A knowledge of the residual noise level permits the operator to properly evaluate the readings during actual distortion tests. Specifically, if the measured residual noise is at or close to the same level as the measured distortion, the noise is overriding the distortion components and an accurate distortion measurement cannot be made.

The most distinguishing feature of the distortion analyzer is the use of two pairs of tones in place of the two noise bands described as test signals in the aforementioned Bell System Technical Reference (PUB 41008). Whereas the two noise band approach requires a long time (on the order of 1 minute) for the meter to average, the two pairs of tones approach requires only a few seconds at worst. The tone pairs are easier to generate than the noise bands and their calibration level can be measured more quickly.

There is no significant disadvantage to employing the two pairs of tones since the amplitude distribution of the four tones closely corresponds to the amplitude distribution of Gaussian noise. Specifically, Gaussian noise is normally considered to have a 10 db crest factor; i.e. the ratio of peak amplitude to RMS value is 10 db. The crest factor for the four tones is 9 db. Thus, for all practical purposes the four discrete tones are as capable of testing the non-linear response region of a telephone channel as are the two noise bands.

An important feature of the distortion analyzer is the fact that is provides direct distortion readings at meter 32 without requiring plural adjustments or mental calculations. This is made possible by the highly linear AGC circuit 23 which automatically adjusts the received test signal level to a reference level against which all distortion measurements can be compared. As another feature of the present invention a highly linear AGC 23 circuit is provided which produces no significant distortion products that can affect the distortion measurement. A functional block diagram of this AGC circuit is illustrated in FIG. 2.

Referring specifically to FIG. 2, the AGC circuit includes a chopper, illustrated schematically as a relay 53 having a normally open contact 54. The chopper takes discrete samples of the input signal at a fixed frequency which is at least twice the frequency of the highest component of interest in the input signal. In the distortion analyzer, interest resides in the audio band in a telephone channel so that a sampling frequency of 10 KHz is suitable. The sampled signal is passed through low pass filter 56 to remove the sampling frequency component and harmonic components introduced by the sampling. The resulting signal is the reference level for the distortion analyzer and it is fed back to a level detector 57 which converts the AC signal to a DC level. Alternatively, two bandpass filters, such as filters 41, 42 which are tuned to the nominal average frequencies of the test tone pairs, may be inserted into the feedback path before level detector 57 to assure that only the test tones, rather than any audio signal, control the setting of the reference level for the distortion analyzer. The detected level from detector 57 is further filtered at amplifier/filter 58 which has a high DC gain. The amplified DC level is applied to comparator 59.

A triangle waveform generator 61 provides a fixed frequency triangular waveform at the sampling frequency. The triangular waveform is applied to comparator 59 which actuates relay 53 during only a portion of the triangular waveform period, as determined by the fed back DC level received from amplifier/filter 58. The feedback signal therefore varies the duty cycle of the sampling signal applied to relay 53; if the DC level increases the sampling interval is shortened, and if the DC level decreases the sampling interval is lengthened. In this manner the amplitude of the sampled signal is maintained constant at the reference level required for automatic distortion analyzer operation.

The primary advantage of the sampling technique in an AGC circuit is its inherently linear characteristic. This extreme linearity produces negligible distortion, thereby making the technique ideal for distortion analyzers which require components that do not mask the distortion measurements with distortion inherent in the measuring equipment. For example, with this technique it is possible to provide constant leveling over a 40 db range of input signal amplitude while producing distortion products no larger than 60 db down from the reference level. A specific embodiment to accomplish this is illustrated schematically in FIG. 3.

Referring specifically to FIG. 3, two cascaded stages of sampling are employed, the samplers comprising field effect transistors Q1 and Q3. These transistors are switched on and off in unison by common-emitter PNP transistor switch Q8 which is alternately switched on and off by the sampling signal. The signal sampled at transistor Q1 is amplified by common-base configured NPN transistor Q2 and is passed to an active low pass filter including operational amplifier A1 and associated resistive-capacitive components. The filtered signal is again sampled at Q3, amplified by NPN transistor Q4 and filtered once again by an active low pass filter comprising operational amplifier A2 and associated resistive-capacitive components. A further amplification stage, in the form of operational amplifier A3 is employed at the output of the second filter to provide the AGC output signal.

The output signal is applied to each of two active filters corresponding to filters 41 and 42, respectively, in FIG. 1. One filter includes two active bandpass filter stages employing operational amplifiers A4 and A5, respectively. The RC components associated with A4 and A5 produce a passband centered at 860 Hz with a bandwidth of approximately 50 Hz. The other filter includes two active bandpass filter stages employing operational amplifiers A6 and A7, respectively. The RC components associated with A6 and A7 produce a passband centered at 1380 Hz with a bandwidth of approximately 50 Hz.

The two signals passed by the filters are summed at the junction of resistors R37 and R142 and are applied to a level detector comprising diode D6, capacitor C23 and resistor R34. The detected DC level is applied to an active low pass filter comprising operational amplifier A8, which has a high DC gain, and associated RC components. The output signal from amplifier A8 is applied to the inverting (−) input terminal of operational amplifier A9 which serves as a comparator. The input signal to the non-inverting (+) input terminal of amplifier A9 is the triangular waveform signal provided by a triangle waveform generator including operational amplifier A10 and associated RC components. Comparator A9, in turn, drives transistor Q8 to alternately open and close sampling transistors Q1 and Q3. The signal provided from amplifier A9 actuates the samplers only when the triangular waveform amplitude is less than the DC level provided from amplifier A8. Consequently, the portion of each triangular waveform period during which sampling occurs changes as the feedback signal amplitude changes. The AGC output signal is thus maintained at the desired constant reference level.

The use of the 860 Hz and 1380 Hz bandpass filters in the AGC feedback path assures only the test tone components of the signal control the amplitude of the reference level. Further, the desired control is achieved using inexpensive components having no need for periodic adjustments and alignments.

The various amplifiers, filters, samplers and signal generators employed in the circuit of FIG. 3 are conventional in nature. Thus, for the sake of brevity and to facilitate understanding to the inventive concepts, each of these individual circuits is not described in detail. Further, power supply connections to the various operational amplifiers have been omitted to facilitate understanding. In an actual working embodiment, the various components of FIG. 3 had the values listed in the following table:

| Component | Value |
|---|---|
| R9 | 7.5K ohms |
| R10 | 4.3K ohms |
| R11 | 1.5K ohms |
| R12 | 10K ohms |
| R14 | 3.9K ohms |
| R15 | 43K ohms |
| R16 | 22K ohms |
| R17 | 20K ohms |
| R18 | 39K ohms |
| R19 | 4.3K ohms |
| R20 | 11K ohms |
| R21 | 1K ohms |
| R22 | 36K ohms |
| R23 | 1K ohms |
| R24 | 3.9K ohms |
| R25 | 750 ohms |
| R26 | 4.3K ohms |
| R27 | 3.9K ohms |
| R28 | 100 ohms |
| R29 | 100 ohms |
| R30 | 43K ohms |
| R31 | 22K ohms |
| R32 | 20K ohms |
| R33 | 100K ohms |
| R34 | 10K ohms |
| R35 | 5K ohms |
| R36 | 150K ohms |
| R37 | 22K ohms |
| R38 | 39K ohms |
| R39 | 4.3K ohms |
| R40 | 36K ohms |
| R41 | 22K ohms |
| R42 | 36K ohms |
| R43 | 13K ohms |
| R44 | 51K ohms |
| R45 | 576 ohms |
| R46 | 200 ohms |
| R47 | 511K ohms |
| R48 | 13K ohms |
| R49 | 51K ohms |
| R50 | 576 ohms |
| R51 | 200 ohms |
| R52 | 510 K ohms |
| R53 | 510 K ohms |
| R66 | 100 K ohms |
| R67 | 9.1K ohms |
| R68 | 205 ohms |

-continued

| Component | Value |
|---|---|
| R69 | 100 ohms |
| R70 | 511K ohms |
| R71 | 100K ohms |
| R72 | 9.1K ohms |
| R73 | 205 ohms |
| R74 | 100 ohms |
| R75 | 511K ohms |
| R90 | 50K ohms |
| R91 | 50K ohms |
| R142 | 22K ohms |
| C10 | 100 pf |
| C11 | 150 μf |
| C12 | .01 μf |
| C13 | 150 μf |
| C14 | .01 μf |
| C15 | .039 μf |
| C16 | 2.2 μf |
| C17 | 6800 pf |
| C18 | 1200 pf |
| C19 | 2.2 μf |
| C20 | .0075 μf |
| C21 | 22 μf |
| C22 | 2.2 μf |
| C23 | 22 μf |
| C24 | .022 μf |
| C25 | 2.2 μf |
| C26 | 6800 pf |
| C27 | 1200 pf |
| C28 | 2.2 μf |
| C31 | 2.2 μf |
| C32 | 47 pf |
| C33 | .01 μf |
| C34 | .01 μf |
| C35 | 47 pf |
| C36 | .01 μf |
| C37 | .01 μf |
| C44 | 180 pf |
| C45 | .01 μf |
| C46 | .01 μf |
| C47 | 180 pf |
| C48 | .01 μf |
| C49 | .01 μf |
| C69 | 2.2 μf |
| A9 and A10 | MC1437L (Motorola) |
| A1 through A8 | MC1458 (Motorola) |
| Q1, Q3 | MPF102 (Motorola) |
| Q2, Q4 | 2N3566 |
| Q8 | 2N5138 |

Another unique circuit employed in the distortion analyzer is RMS detector circuit 37, illustrated in detail in FIG. 4. As illustrated, the two second order distortion signals are summed at the junction resistors R81 and R82 and are AC-coupled to the inverting input terminal of operational amplifier A11. The non-inverting input terminal of amplifier A11 is grounded. The signal level at the output of amplifier A11 is maintained substantially constant by means of a feedback circuit employing operational transconductance amplifier A12. The latter may be model CA3080 manufactured by the RCA Solid State Division and functions to provide an output current which is proportional to the transconductance of the amplifier, which in turn is proportional to the bias current supplied on bias input line 61. The non-inverting (+) input terminal of transconductance amplifier A12 receives the output signal from input amplifier A11; the inverting (−) input terminal of A11 is grounded. The bias current on control line 61 is controlled by the collector-emitter path of PNP transistor Q1, through a resistive divider circuit. The base of Q1 is controlled by feedback operational amplifier A15 which is linearly driven by the overall output voltage $V_o$ for the RMS detector circuit. Amplifier A15 and transistor Q1 serve to provide a linear voltage-to-current converter for the fed back output voltage $V_o$. Thus, the current on control line 61 of transconductance amplifier A12 is proportional to the output voltage $V_o$. Consequently, the gain of amplifier A12 is proportional to $V_o$.

The effect of transconductance amplifier A12 connected in feedback relation with amplifier A11 is to render the output voltage from amplifier A11 constant. An expression for this voltage may be written as:

$$V_{11} = \frac{-A11}{1 + (A11)(K_1)(V_o)} \cdot (V_{in}) \quad (1)$$

where $V_{11}$ is the output voltage provided by amplifier A11, (A11) is the gain of amplifier A11, $K_1$ is a constant related to the nominal gain of amplifier A12, $V_o$ is the output voltage of the overall circuit which controls the gain of A12, and $V_{in}$ represents the input voltage applied to the overall circuit. Expression (1) can be simplified, due to the fact that (A11) is much larger than 1, so that $$V_{11} \doteq \frac{-V_{in}}{K_1 V_o} \quad (2).$$

The output voltage from amplifier A11 is applied to both the non-inverting (+) input terminal and control line 62 for operational transconductance amplifier A13. This amplifier is of the same general type as amplifier A12 and, when connected as shown and described, provides an output voltage which is proportional to the square of the input voltage. Since the input signal ($V_{11}$) to amplifier A12 is substantially constant, and since the output signal from A13 is proportional to the square of $V_{11}$, the output signal from A13 must also be substantially constant. The output voltage from A13 can therefore be represented as $$C = \left(\frac{V_{in}}{K_1 V_o}\right)^2 \quad (3)$$

where $C$ is a constant. Solving for $V_o$ in expression (3) yields the following:

$$V_o = \frac{\sqrt{V_{in}^2}}{K_1 C} \quad (4)$$

and since $K_1$ and $C$ are constants, $$V_o = \frac{\sqrt{V_{in}^2}}{K_2} \quad (5)$$

where $K_2$ is a constant equal to $K_1 \sqrt{C}$.

The signals represented as INPUT No. 1 and INPUT No. 2 in FIG. 4 are actually two sets of four sinusoids corresponding to the second order intermodulation products centered at 520 Hz and 2240 Hz, respectively. To simply illustrate the workings of the circuit assume that $V_{in}$ is the sum of two sinusoidal signals which may be represented by the expressions A cos $\alpha$ and B cos $\beta$, respectively. Thus, $V_{in}$ may be prepresented as $$V_{in} = A \cos \alpha + B \cos \beta \quad (6)$$

and, upon squaring $$V_{in}^2 = A^2\cos^2\alpha + B^2\cos^2\beta + 2AB\cos\alpha\cos\beta. \quad (7)$$

By the use of the trigometric identity:

$$\cos^2\alpha = \tfrac{1}{2}(1 + \cos 2\alpha), \quad (8)$$

expression (7) can be expanded as follows:

$$V_{in}^2 = \frac{A^2}{2} + \frac{B^2}{2} + A^2\cos 2\alpha + B^2\cos 2\beta + 2AB\cos\alpha\cos\beta. \quad (9)$$

All but the first two terms of expression (9) are AC components; the first two terms are DC components representing the mean squared terms of the two input sinusoids. If for the moment we ignore the AC components of $V_{in}^2$ in expression (9) and substitute only the DC components into expression (5), the result is:

$$V_o = \frac{\sqrt{\frac{A^2}{2} + \frac{B^2}{2}}}{K_2} \quad (10)$$

providing the desired result of rendering the output voltage $V_o$ proportional to the RMS (or square root of the mean squared) value of the input voltage. To justify ignoring the AC terms in expression (9) and thereby obtain the desired RMS conversion, a low pass active filter having a high DC gain is provided at the output of amplifier A13. This active low pass filter is in effect an integrator employing operational amplifier A14 and feedback capacitor C62. The output voltage from this high gain low pass filter is $V_o$, the RMS output voltage.

The important feature of the RMS circuit is the use of a "slide back" technique, using the output voltage in a negative feedback arrangement to maintain the input level to the squaring circuit substantially constant. This technique places minimal demands on the range of signal levels handled by the squaring circuit; thus accurate RMS representation of a large range of input signal levels can be had using an inexpensive squaring device.

The diode D2 in the active low pass filter is employed to limit the positive swing of the output signal $V_o$ during transient conditions so that filter capacitor C62 is not damaged. Transistor Q3 and associated circuitry provides temperature compensation for the circuit.

In an actual working embodiment of the RMS circuit of FIG. 4, the following component values were employed.

| Component | Value |
| --- | --- |
| R81 | 180K ohms |
| R82 | 180K ohms |
| R85 | 10K ohms |
| R86 | 4.7K ohms |
| R88 | 50K ohms |
| R89 | 37K ohms |
| R90 | 200 ohms |
| R91 | 100K ohms |
| R92 | 51 ohms |
| R101 | 39K ohms |
| R102 | 51 ohms |
| R103 | 18K ohms |
| R109 | 39K ohms |
| R110 | 2.7K ohms |
| R112 | 10K ohms |
| R114 | 1.2K ohms |
| R115 | 12K ohms |
| C51 | 2.2 μf |
| C53 | 22 μf |
| C61 | 2.2 μf |
| C62 | 6.8 μf |
| A11, A15, A14 | MC1458 (Motorola) |
| A12, A13 | CA3080 (RCA) |
| Q1, Q3 | 2N5138 |

Still another unique circuit employed in the distortion analyzer in the non-linear circuit 19, illustrated in detail in FIG. 5. This circuit employs a single operational amplifier A50 having its non-inverting (+) input terminal grounded. Input signal is applied to the inverting (−) input terminal via resistor RG. The output signal for the circuit is taken across load resistor RF. Three signals are summed at RF, each comprising a current component flowing through RF. A first path includes RE which is connected between the output terminal and the input terminal.

A second path is connected in parallel with RE and includes series-connected resistor RD and diode DA. The diode is poled so that its cathode is connected to the circuit output terminal. A third signal path includes RG connected between the input terminal and the (−) input terminal of the amplifier, RA connected directly between the output terminal and (−) input terminal of the amplifier, and RB and RC connected in series between the output terminal and the output terminal of the amplifier.

The function of the circuit in FIG. 5 is to produce a known amount of second and third order intermodulation distortion in an applied input signal. To this end the circuit produces a linear and two non-linear components which are superimposed on the output signal. Resistor RE provides the linear component. The feedback path including resistor RD and diode DA produces a second order intermodulation distortion component. Resistors RB and RC, in combination with RG, RA and the gain characteristic of amplifier A50, provide a third order intermodulation distortion component. In this regard A50 is operated with a high gain to produce clipping of the output signal; RB can then be adjusted as necessary to provide the desired amount of third order distortion component.

As a practical matter, the second order distortion level is substantially independent of the gain characteristic of amplifier A50. Consequently, by properly selecting RD and DA it is possible to provide a predetermined level of second order distortion. The third order distortion, however, being dependent on the gain characteristic of A50, requires adjustment in the form of variable resistor RB to assume the desired third order distortion level. Thus to check out the distortion analyzer in the DIST. CHECK mode, the meter selection switch 24 can be placed in either the second or third position. If a predetermined meter reading is obtained in each case the analyzer is operating properly.

In an actual working embodiment of the circuit of FIG. 5, the following components values were employed:

| Component | Value |
| --- | --- |
| RA | 200K ohms |
| RB | 100K ohms |
| RC | 430K ohms |
| RD | 82K ohms |
| RE | 10K ohms |
| RF | 510 ohms |
| RG | 10K ohms |
| A50 | MC1458 (Motorola) |

CONCLUSION

In summary, the features and advantages of the invention are as follows:

1. The distortion analyzer uses two pairs of two tones as the test signal. This has the same advantages as using two narrow bands of noise (e.g. a 9 dB crest factor) without the disadvantage of long time averaging required for metering noise. The shorter time averaging using the four tone system enables the unit to follow time varying distortion products that would be averaged out using longer time constants.

2. Distortion is measured using intermodulation techniques with all necessary components built into one unit (i.e. a multiple signal source and means for measuring intermodulation levels relative to the test signal level).

3. The distortion product level is automatically read out directly in dB below the test signal.

4. Distortion is measured without having to set a reference level. A highly linear automatic leveling circuit adjusts the test signal to reference level.

5. The automatic leveling circuit uses filtering in the feedback path so that only the test signal, rather than any in band signal, controls the setting of the reference level.

6. True rms level is measured for two second order in-band products.

7. Caution indications alarm the user to the following conditions which may cause a measurement error:
  a. LEVEL indicator lights when test signal is above or below AGC operating range.
  b. SPURIOUS indicator lights to caution when presence of a high level spurious tone or unusually high distortion rendering measurement questionable.
  c. TWIST indicator cautions of gross signal tilt indicating a channel with gross frequency response problems which will effect the measurements.

8. A built-in distortion check provides the measurement section with a signal of known distortion as an operational confidence check.

9. A build-in signal/noise check allows user to distinguish between measurements due to noise vs measurements due to non-linear distortion by inhibiting one set of tones and increasing the other set 3 dB.

10. A highly linear AGC circuit maintains the reference level constant for a greater than 40 dB range of input level, without causing any distortion products larger than 50 db down from test signal.

11. A simple but accurate RMS detector uses inexpensive components.

12. A distortion check circuit provides known second and third order distortion components. The circuit is insensitive to temperature and uses inexpensive components.

It should also be pointed out that the sinusoidal purity of the four test tones is not important. In fact, it is possible to utilize square waves at the basic four frequencies; the fundamental components interact appropriately to produce the desired system effects.

While we have described and illustrated specific embodiments of our invention, it will be clear that variations of the details of construction which are specifically illustrated and described may be resorted to without departing from the true spirit and scope of the invention as defined in the appended claims.

We claim:
1. A linear automatic gain control circuit, comprising:
  an input terminal;
  an output terminal;
  sampling means, having a fixed sampling frequency and a voltage-controlled duty cycle, for passing discrete periodic samples of signals applied to said input terminal, said samples having said sampling frequency and the same duty cycle as said sampling means;

low pass filter means for receiving the signal passed by said sampling means and passing to said output terminal only frequency components of the received signal which are below said sampling frequency; and control means responsive to the level of signal passed by said low pass filter means for applying a corresponding control voltage to said sampling means to adjust the duty cycle at said sampling means.

2. The gain control circuit according to claim 1 wherein said sampling means comprises:

a fixed frequency signal generator for providing a repetitive triangular wave signal;

a comparator responsive to said triangular wave signal and said control voltage terminal for providing an output pulse once during each cycle of said triangular wave for an interval corresponding to that during which said triangular wave signal is at a lower level than said control votlage; and switch means for passing said samples only during the intervals of said output pulses.

3. The gain control circuit according to claim 1 wherein said sampling means comprises:

a first switch capable of being switched on and off to alternately pass and block said input signals;

means for generating, at said sampling frequency, an alternating signal having a voltage which varies linearly with time between two levels; and comparator means for maintaining said first switch off when the voltage of said alternating signal exceeds said DC level and for maintaining said first switch on when said DC level exceeds the voltage of said alternating signal;

and wherein said control means comprises:

detector means for converting the output signal at said output terminal to a DC level proportional to the amplitude of said output signal.

4. The gain control circuit according to claim 3 wherein said control means includes bandpass filter means for passing to said detector means only predetermined frequency components appearing at said output terminal.

5. The gain control circuit according to claim 4 wherein said sampling means further comprises a second switch connected in series with said first switch and arranged to be maintained on by said output pulses; and wherein said low pass filter means includes a first low pass filter connected between said first and second switches, and a second low pass filter connected between said second switch and said output terminal.

6. A linear automatic gain control circuit comprising:
an input terminal;
an output terminal;
a signal transmission gate having a gating terminal and a signal transmission path which passes signal when a gating signal is applied to said gating terminal and blocks signal passage in the absence of said gating signal at said gating terminal;
a low pass filter having a predetermined cut-off frequency;
means connecting said signal transmission path of said gate in series between said input terminal and said low pass filter;
means connecting signal passed by said low pass filter to said output terminal;
a signal source providing a repetitive signal at a fixed frequency with a voltage amplitude waveform that varies in a prescribed manner with time;
feedback means responsive to the amplitude of signal passed by said low pass filter for providing a control signal having a d.c. level which is a predetermined function of the amplitude of signal passed by said low pass filter;
comparator means connected to receive said repetitive signal and said control signal for providing applying said gating signal to said gating terminal only when the amplitude difference between said repetitive signal and control signal has a predetermined polarity.

7. The linear automatic gain control circuit according to claim 6 wherein said signal source is a triangular waveform generator and wherein said feedback means includes detector means for providing said control signal at said d.c. level in direct proportion to the amplitude of signal passed by said low pass filter.

8. The linear automatic gain control circuit according to claim 7 further comprising bandpass filter means as part of said feedback means for passing only preselected frequency components to said detector means.

* * * * *